(12) United States Patent
Chakraborty et al.

(10) Patent No.: US 9,184,364 B2
(45) Date of Patent: Nov. 10, 2015

(54) PIPELINE THERMOELECTRIC GENERATOR ASSEMBLY

(75) Inventors: Swapan Chakraborty, Eden Prairie, MN (US); Robert J. Karschnia, Chaska, MN (US)

(73) Assignee: Rosemount Inc., Eden Prairie, MN (US)

( * ) Notice: Subject to any disclaimer, the term of this patent is extended or adjusted under 35 U.S.C. 154(b) by 1138 days.

(21) Appl. No.: 11/529,780

(22) Filed: Sep. 28, 2006

(65) Prior Publication Data

US 2008/0083446 A1   Apr. 10, 2008

(51) Int. Cl.
  *H01L 35/30* (2006.01)
  *H01L 35/00* (2006.01)

(52) U.S. Cl.
  CPC ............... *H01L 35/30* (2013.01); *H01L 35/00* (2013.01)

(58) Field of Classification Search
  CPC ......... H01L 35/00; H01L 35/30; H01L 35/34; H01L 35/02; H01L 35/06; H01L 35/28; H01L 35/32
  USPC ................................................. 136/200–242
  See application file for complete search history.

(56) References Cited

U.S. PATENT DOCUMENTS

| | | | |
|---|---|---|---|
| 2,410,872 A * | 11/1946 | Findley | 136/209 |
| 2,883,489 A | 4/1959 | Eadie, Jr. et al. | 335/148 |
| 3,229,759 A | 1/1966 | Grover | 165/105 |
| 3,232,712 A | 2/1966 | Stearns | 23/255 |
| 3,497,397 A * | 2/1970 | Ludwig | 136/208 |
| 3,568,762 A | 3/1971 | Harbaugh | 165/104.26 |
| 3,612,851 A | 10/1971 | Fowler | 362/30 |
| D225,743 S | 1/1973 | Seltzer | D10/102 |
| 3,881,962 A * | 5/1975 | Rubinstein | 136/209 |
| 3,931,532 A | 1/1976 | Byrd | 310/4 |
| 4,026,348 A | 5/1977 | Roberts, Jr. | 165/272 |
| 4,042,757 A | 8/1977 | Jones | 429/104 |
| 4,125,122 A | 11/1978 | Stachurski | 136/205 |
| 4,322,724 A | 3/1982 | Grudzinski | 340/595 |
| 4,370,890 A | 2/1983 | Frick | 73/18 |
| 4,383,801 A | 5/1983 | Pryor | 416/17 |
| 4,389,895 A | 6/1983 | Rud, Jr. | 73/724 |
| 4,476,674 A * | 10/1984 | Berman | 60/39.182 |
| 4,476,853 A | 10/1984 | Arbogast | 126/578 |
| 4,485,670 A | 12/1984 | Camarda et al. | 73/179 |
| 4,590,466 A | 5/1986 | Wiklund et al. | 340/870.28 |
| 4,639,542 A | 1/1987 | Bass et al. | 436/210 |

(Continued)

FOREIGN PATENT DOCUMENTS

CH    672 368 A5   11/1989
CN    06 199284 A   7/1994

(Continued)

OTHER PUBLICATIONS

English machine translation of JP2004208476 A.*

(Continued)

*Primary Examiner* — Christina Chern
(74) *Attorney, Agent, or Firm* — Westman, Champlin & Koehler, P.A.

(57) ABSTRACT

A thermoelectric generator assembly. The thermoelectric generator assembly comprises a thermoelectric generator. The thermoelectric generator has a hot junction flange, a cold junction flange and a thermoelectric power output. The thermoelectric generator assembly generates electrical power from heat differentials for use in powering field devices in industrial process monitoring and control systems.

11 Claims, 8 Drawing Sheets

(56) References Cited

U.S. PATENT DOCUMENTS

| | | | |
|---|---|---|---|
| 4,651,019 A | 3/1987 | Gilbert et al. | 307/43 |
| 4,704,607 A | 11/1987 | Teather et al. | 340/825.07 |
| 4,749,993 A | 6/1988 | Szabo et al. | 340/870.31 |
| 4,860,232 A | 8/1989 | Lee et al. | 364/571.04 |
| 4,878,012 A | 10/1989 | Schulte et al. | 324/60 |
| 4,977,480 A | 12/1990 | Nishihara | 73/724 |
| 5,062,442 A * | 11/1991 | Stenstrom et al. | 137/110 |
| 5,094,109 A | 3/1992 | Dean et al. | 73/718 |
| D331,370 S | 12/1992 | Williams | D10/46 |
| D345,107 S | 3/1994 | Williams | D10/46 |
| 5,313,831 A | 5/1994 | Beckman | 73/204.24 |
| 5,329,818 A | 7/1994 | Frick et al. | 73/708 |
| 5,412,535 A | 5/1995 | Chao et al. | 361/700 |
| 5,495,769 A | 3/1996 | Broden et al. | 73/18 |
| 5,531,936 A | 7/1996 | Kanatzidis et al. | 252/587 |
| 5,554,809 A | 9/1996 | Tobita et al. | 73/700 |
| 5,606,513 A | 2/1997 | Louwagie et al. | 702/138 |
| 5,614,128 A | 3/1997 | Kanatzidis et al. | 252/582 |
| 5,618,471 A | 4/1997 | Kanatzidis et al. | 252/582 |
| 5,637,802 A | 6/1997 | Frick et al. | 73/724 |
| 5,642,301 A | 6/1997 | Warrior et al. | 364/571.02 |
| 5,644,185 A | 7/1997 | Miller | 310/306 |
| 5,656,782 A | 8/1997 | Powell, II et al. | 73/756 |
| 5,665,899 A | 9/1997 | Willcox | 731/1.63 |
| 5,682,476 A | 10/1997 | Tapperson et al. | 395/200.05 |
| 5,705,978 A | 1/1998 | Frick et al. | 340/511 |
| 5,722,249 A | 3/1998 | Miller, Jr. | 62/238.2 |
| 5,793,963 A | 8/1998 | Tapperson et al. | 395/200.31 |
| 5,803,604 A | 9/1998 | Pompei | 374/181 |
| 5,851,083 A | 12/1998 | Palan | 403/337 |
| 5,870,695 A | 2/1999 | Brown et al. | 702/138 |
| 5,872,494 A | 2/1999 | Palan et al. | 333/252 |
| 5,899,962 A | 5/1999 | Louwagie et al. | 702/138 |
| 5,929,372 A | 7/1999 | Oudoire et al. | 136/208 |
| 5,954,526 A | 9/1999 | Smith | 439/136 |
| 5,978,658 A | 11/1999 | Shoji | 455/66 |
| 6,013,204 A | 1/2000 | Kanatzidis et al. | 252/584 |
| 6,079,276 A | 6/2000 | Frick et al. | 73/18 |
| 6,127,739 A | 10/2000 | Appa | 290/55 |
| 6,233,944 B1 | 5/2001 | Yamada et al. | 62/3.7 |
| 6,282,247 B1 | 8/2001 | Shen | 75/245 |
| 6,295,875 B1 | 10/2001 | Frick et al. | 73/718 |
| 6,312,617 B1 | 11/2001 | Kanatzidis et al. | 363/62.3 |
| 6,338,283 B1 | 1/2002 | Blazquez Navarro et al. | 73/865.8 |
| 6,360,277 B1 | 3/2002 | Ruckley et al. | 709/250 |
| 6,385,972 B1 | 5/2002 | Fellows | 60/517 |
| 6,405,139 B1 | 6/2002 | Kicinski et al. | 702/33 |
| 6,508,131 B2 | 1/2003 | Frick | 73/756 |
| 6,510,740 B1 * | 1/2003 | Behm et al. | 73/708 |
| 6,574,515 B1 | 6/2003 | Kirkpatrick et al. | 700/19 |
| 6,667,594 B2 | 12/2003 | Chian | 318/696 |
| 6,711,446 B2 | 3/2004 | Kirkpatrick et al. | 700/19 |
| 6,747,572 B2 * | 6/2004 | Bocko et al. | 340/870.16 |
| 6,747,573 B1 | 6/2004 | Gerlach et al. | 340/870.21 |
| 6,778,100 B2 | 8/2004 | Schempf | 340/870.07 |
| 6,792,259 B1 | 9/2004 | Parise | 455/343.1 |
| 6,838,859 B2 | 1/2005 | Shah | 322/38 |
| 6,839,546 B2 | 1/2005 | Hedtke | 455/67.11 |
| 6,843,110 B2 | 1/2005 | Deane et al. | 73/114.35 |
| 6,891,477 B2 | 5/2005 | Aronstam | 340/606 |
| 6,904,295 B2 | 6/2005 | Yang | 455/522 |
| 6,907,383 B2 | 6/2005 | Eryurek et al. | 702/183 |
| 6,910,332 B2 | 6/2005 | Fellows | 60/520 |
| 6,942,728 B2 | 9/2005 | Caillat et al. | 117/3 |
| 6,981,380 B2 * | 1/2006 | Chrysler et al. | 62/3.2 |
| 6,995,677 B2 | 2/2006 | Aronstam et al. | 340/606 |
| 7,010,294 B1 | 3/2006 | Pyotsia et al. | 455/420 |
| 7,036,983 B2 | 5/2006 | Green et al. | 374/179 |
| 7,197,953 B2 | 4/2007 | Olin | 73/866.5 |
| 7,301,454 B2 | 11/2007 | Seyfang et al. | 340/539.26 |
| 7,329,959 B2 | 2/2008 | Kim et al. | 290/2 |
| 2001/0025349 A1 | 9/2001 | Sharood et al. | 713/340 |
| 2002/0029130 A1 | 3/2002 | Eryurek et al. | 702/183 |
| 2002/0065631 A1 | 5/2002 | Loechner | 702/188 |
| 2002/0148236 A1 | 10/2002 | Bell | 62/3.3 |
| 2003/0000681 A1 | 1/2003 | Reisfeld | 165/104.26 |
| 2003/0043052 A1 | 3/2003 | Tapperson et al. | 340/825.37 |
| 2003/0079553 A1 | 5/2003 | Cain et al. | 73/861.27 |
| 2003/0143958 A1 | 7/2003 | Elias et al. | 455/73 |
| 2003/0171827 A1 | 9/2003 | Keyes, IV et al. | 700/19 |
| 2004/0033704 A1 | 2/2004 | Selli et al. | 439/8 |
| 2004/0142733 A1 | 7/2004 | Parise | 455/572 |
| 2004/0159235 A1 | 8/2004 | Marganski et al. | 95/116 |
| 2004/0199681 A1 | 10/2004 | Hedtke | 710/37 |
| 2004/0200519 A1 | 10/2004 | Sterzel et al. | 35/30 |
| 2004/0203434 A1 | 10/2004 | Karschnia et al. | 455/67.11 |
| 2004/0214543 A1 | 10/2004 | Osone et al. | 455/197.2 |
| 2004/0242169 A1 | 12/2004 | Albsmeier et al. | 455/91 |
| 2005/0023858 A1 | 2/2005 | Bingle et al. | 296/76 |
| 2005/0029236 A1 | 2/2005 | Gambino et al. | 219/121.69 |
| 2005/0046595 A1 | 3/2005 | Blyth | 340/908 |
| 2005/0076944 A1 | 4/2005 | Kanatzidis et al. | 136/239 |
| 2005/0078451 A1 * | 4/2005 | Sauciuc et al. | 361/700 |
| 2005/0082368 A1 * | 4/2005 | Watanabe | 235/451 |
| 2005/0115601 A1 | 6/2005 | Olsen et al. | 136/212 |
| 2005/0118468 A1 | 6/2005 | Adams et al. | 429/22 |
| 2005/0130605 A1 | 6/2005 | Karschnia et al. | 455/90.3 |
| 2005/0139250 A1 | 6/2005 | DeSteese et al. | 136/212 |
| 2005/0150535 A1 | 7/2005 | Samavedam et al. | 136/201 |
| 2005/0182501 A1 | 8/2005 | Franchuk et al. | 700/81 |
| 2005/0201349 A1 | 9/2005 | Budampati | 370/342 |
| 2005/0208908 A1 | 9/2005 | Karschnia et al. | 455/127.1 |
| 2005/0222698 A1 | 10/2005 | Eryurek et al. | 700/90 |
| 2005/0245291 A1 | 11/2005 | Brown et al. | 455/572 |
| 2005/0281215 A1 | 12/2005 | Budampati et al. | 370/328 |
| 2005/0289276 A1 | 12/2005 | Karschnia et al. | 710/305 |
| 2006/0002368 A1 | 1/2006 | Budampati et al. | 370/351 |
| 2006/0036404 A1 | 2/2006 | Wiklund et al. | 702/183 |
| 2006/0060236 A1 * | 3/2006 | Kim | 136/203 |
| 2006/0063522 A1 | 3/2006 | McFarland | 455/423 |
| 2006/0077917 A1 | 4/2006 | Brahmajosyula et al. | 370/310 |
| 2006/0092039 A1 | 5/2006 | Saito et al. | 340/825.37 |
| 2006/0148410 A1 | 7/2006 | Nelson et al. | 455/67.11 |
| 2006/0227729 A1 | 10/2006 | Budampati et al. | 370/278 |
| 2006/0266404 A1 * | 11/2006 | Hiller et al. | 136/205 |
| 2006/0274644 A1 | 12/2006 | Budampati et al. | 370/216 |
| 2006/0274671 A1 | 12/2006 | Budampati et al. | 370/254 |
| 2006/0287001 A1 | 12/2006 | Budampati et al. | 455/552.1 |
| 2007/0006528 A1 | 1/2007 | Diebold et al. | 48/197 R |
| 2007/0030816 A1 | 2/2007 | Kolavennu | 370/252 |
| 2007/0030832 A1 | 2/2007 | Gonia et al. | 370/338 |
| 2007/0054630 A1 | 3/2007 | Scheible et al. | 455/90.3 |
| 2007/0275755 A1 | 11/2007 | Chae | 455/557 |
| 2008/0010600 A1 | 1/2008 | Katano | 715/748 |
| 2008/0083446 A1 | 4/2008 | Chakraborty et al. | 136/205 |
| 2008/0141769 A1 | 6/2008 | Schmidt et al. | 73/204.19 |

FOREIGN PATENT DOCUMENTS

| | | |
|---|---|---|
| DE | 33 40 834 A1 | 5/1985 |
| DE | 196 08 310 | 7/1997 |
| DE | 201 07 112 U1 | 8/2001 |
| DE | 20107112 | 8/2001 |
| DE | 101 04 582 A1 | 10/2001 |
| DE | 101 28 447 | 1/2003 |
| EP | 0 524 550 A1 | 7/1992 |
| EP | 1 293 853 | 9/2001 |
| EP | 1 202 145 | 5/2002 |
| EP | 1 482 568 A2 | 2/2004 |
| EP | 1 482 568 A2 | 12/2004 |
| GB | 1 394 435 A | 6/1975 |
| GB | 1 397 435 A | 6/1975 |
| GB | 2 145 876 | 3/1985 |
| GB | 1 145 876 | 4/1985 |
| GB | 2 145 876 A | 4/1985 |
| GB | 2293446 | 3/1996 |
| GB | 2293446 A | 3/1996 |
| GB | 2310498 | 8/1997 |
| GB | 2 320 733 | 7/1998 |
| GB | 2 320 733 A | 7/1998 |
| JP | 51-110983 A | 9/1976 |
| JP | 59-075684 | 4/1984 |
| JP | 59-158345 | 10/1984 |

(56) References Cited

FOREIGN PATENT DOCUMENTS

| | | |
|---|---|---|
| JP | 60-125181 | 7/1985 |
| JP | 60-125181 A | 7/1985 |
| JP | 61-154087 | 7/1986 |
| JP | 2067794 | 3/1990 |
| JP | 06 199284 A | 7/1994 |
| JP | 11-36981 | 2/1999 |
| JP | 11-036981 | 2/1999 |
| JP | 11036981 | 2/1999 |
| JP | 11-87786 | 3/1999 |
| JP | 11-121816 A | 4/1999 |
| JP | 11-215867 | 8/1999 |
| JP | 2000171181 A | 6/2000 |
| JP | 2000/321361 | 11/2000 |
| JP | 2000-321361 | 11/2000 |
| JP | 2001/222787 | 8/2001 |
| JP | 2001-222787 | 8/2001 |
| JP | 2001-263649 | 9/2001 |
| JP | 2001-349763 | 12/2001 |
| JP | 2002/048618 | 2/2002 |
| JP | 2002-048618 | 2/2002 |
| JP | 2002-369554 | 12/2002 |
| JP | 2003051894 | 2/2003 |
| JP | 2003-110156 | 4/2003 |
| JP | 2003-113850 | 4/2003 |
| JP | 2003/113850 | 4/2003 |
| JP | 2003134261 | 5/2003 |
| JP | 2003-168182 | 6/2003 |
| JP | 2003/168182 | 6/2003 |
| JP | 2004021877 | 1/2004 |
| JP | 2004-129442 | 4/2004 |
| JP | 2004208476 | 7/2004 |
| JP | 2004208476 A * | 7/2004 ............ H04N 11/00 |
| JP | 2004-296961 | 10/2004 |
| JP | 2004-349651 | 12/2004 |
| JP | 2005-72080 | 3/2005 |
| JP | 2005072080 | 3/2005 |
| JP | 2006-214350 | 8/2006 |
| RU | 2 131 934 C1 | 6/1999 |
| WO | WO 88/05964 | 8/1988 |
| WO | WO 91/11029 | 7/1991 |
| WO | WO 95/07522 | 3/1995 |
| WO | WO 99/53286 | 10/1999 |
| WO | WO 03/023536 | 3/2003 |
| WO | WO 03/089881 | 10/2003 |
| WO | WO 2004/059139 | 7/2004 |
| WO | WO 2004/082051 | 9/2004 |
| WO | WO 2004/094892 | 11/2004 |
| WO | WO 2005/086331 | 9/2005 |
| WO | WO 2005/060482 | 7/2007 |

OTHER PUBLICATIONS

"Invitation to Pay Additional Fees and Partial Search Report", PCT/US2007/019396, dated Oct. 7, 2008.
"Notification of Transmittal of the International Search Report and the Written Opinion", PCT/US2007/019636, dated Oct. 1, 2008.
"Every little helps," Economist, p. 78, vol. 278, No. 8469, ISSN 0013-0613, Mar. 18, 2006.
"Heat pipe-Wikipedia, the free encylopedia", http://en.wikipedia.org/wiki/Heat_pipe, 3 pages, Mar. 31, 2006.
"Thermal Design and Heat Sink Manufacturing & Testing—Total Thermal and Heat Sink . . . ", http://www.enertron-inc.com/enertron-products/integated-heat-sink.php, 2 pages, Mar. 31, 2006.
EP Communication from related application European Patent Application No. 07837769.4-1235, dated Jul. 14, 2009.
Decision on refusal to grant a patent for inventor for Russian Patent Application No. 2006145434, dated Mar. 23, 2009.
International Search Report and Written Opinion in Application No. PCT/US2006/035728, filed Sep. 13, 2006.
International Search Report and Written Opinion of Application No. PCT/US2005/015848, file May 5, 2005.
International Search Report and Written Opinion in Appln No. PCT/US2005/021757, filed Jun. 21, 2005.
Notification of Transmittal of the International Search Report or the Declaration—PCT/US03/10403.
"Wireless R&D Aims to Boost Traffic", by M. Moore, InTech with Industrial Computing, Feb. 2002, 3 pgs.
"System Checks Faraway Machines' Health", by J. Strothman, InTech with Industrial Computing, Feb. 2002, 1 pg.
"Wireless Management Toolkit XYR 5000", by Honeywell International Inc., Phoenix, Arizona, 3 pgs., Oct. 2003.
"Wireless Analog Input Transmitters XYR 5000", by Honeywell International Inc., Phoenix, Arizona, 4 pgs., Oct. 2003.
"Quad Analog Output Module Installation and User's Manual", by Honeywell International Inc., Phoenix, Arizona, pp. Ii, iii, iv and 1-12, Dec. 2003.
"Wireless Dual Analog Input Interface Transmitter Installation and User's Manual", by Honeywell International Inc., Phoenix, Arizona, pp. Ii-vi and 7-43, Dec. 2003.
"XYR 5000 Wireless Dual Analog Input Interface, Model Selection Guide", by Honeywell International Inc., Phoenix, Arizona, Dec. 2003.
"Wireless Measure, Monitor & Control", by Accutech, 4 pgs. May 2003.
"Wireless Instrumentation, Multi-Input Field Unit", by Accutech, 2 pgs., Dec. 2003.
"Quad Analog Output Module", by Accutech, 1 pg. Dec. 2003.
3 Pages from Website www.chemicalprocessing.com, Apr. 2004.
4 Pages from Website http://content.honeywell.com/imc/eznews/eznews0403/news.htm, 2004.
First Office Action of Chinese patent application 200580006438.X, filed Mar. 2, 2005.
Examiner's consultation for European patent application 05 724 190.3, filed Mar. 2, 2005.
Examination Report of the European Patent Office in counterpart foreign application No. 05724190.3 filed Mar. 2, 2005.
Second Office Action from Chinese patent application No. 200580014212.4, filed May 2005.
USA & Metric Thread Standards http://www.carrlane.com/Catalog/index.cfm/29425071FOB221118070C1C513906103E05543B0B05543B0B012009083C3B285357474A2D020609090C0015312A36515F554A5B.
Official Action in Application No. 2006145434/09, filed May 5, 2005.
Official Communication in Application No. 05746241.8, filed May 5, 2005.
First Examination Report for Indian Application No. 3589/CHENP/2006, dated Apr. 17, 2009.
Second Office Action from Chinese Patent Application No. 200580006438.X, dated Apr. 10, 2009.
English translation of Official Office Action from Russian patent application 2006134646/06, dated Mar. 17, 2008.
Notification of Transmittal of the International Search Report and the Written Opinion in related application PCT/US2007/019396, dated Feb. 13, 2009.
Communication from European Patent Application No. 07837963.3, dated Sep. 4, 2009.
Communication from Chinese Patent Application No. 200580006438.X, dated Sep. 18, 2009.
Communication from Chinese Patent Application No. 200580006438.X, dated Apr. 10, 2009.
Notification of Transmittal of International Search Report and the Written Opinion in connection with PCT/US2005/006596, dated Sep. 6, 2005.
Communication from European Patent Application 05724190.3, dated Aug. 1, 2007.
Communication from Indian Patent Application No. 3589/CHENP/2006, dated Apr. 17, 2009.
Communication from European Patent Office dated Mar. 2, 2010 for European application No. 06 803 540.1.
Foundation Fieldbus Power Supply, A Look at Powering Fieldbus, www.analogservices.com/fbsupp2.pdf, Oct. 22, 2000.
Fourth Office Action from Chinese application No. 2005/80006438.X dated May 17, 2010.
Office Action for Japanese patent application No. 2007-501903, dated Jan. 20, 2010.

(56) References Cited

OTHER PUBLICATIONS

Notice of Opposition for European U.S. Pat. No. 1721067 dated Sep. 13, 2010.
Translation of Notice of Opposition for European U.S. Pat. No. 1721067 dated Sep. 2, 2010.
Translation of DE20107112 published Aug. 9, 2001, Art cited "D4", 10 pages.
The Rejection Decision for related Chinese patent application No. 200780035788.8, dated Jun. 21. 2011, 7 pages.
First Chinese Office Action (with English translation) for Chinese Application No. 200780035775.0, dated Oct. 25, 2011, 29 pgs.
Japanese Office Action from corresponding application Serial No. JP 2009-530353, dated Nov. 1, 2011, 10 pgs.
Japanese Office Action for corresponding Japanese Patent Application No. 2009-530357, dated Dec. 20, 2011, 9 pages.
Communication pursuant to Article 94(3) EPC for European Application No. 07 837 769.4-1235, dated Aug. 14, 2012, 4 pages.
Second Office Action for Chinese Patent Application No. 200780035775.0, dated May 2, 2012, 8 pages.

* cited by examiner

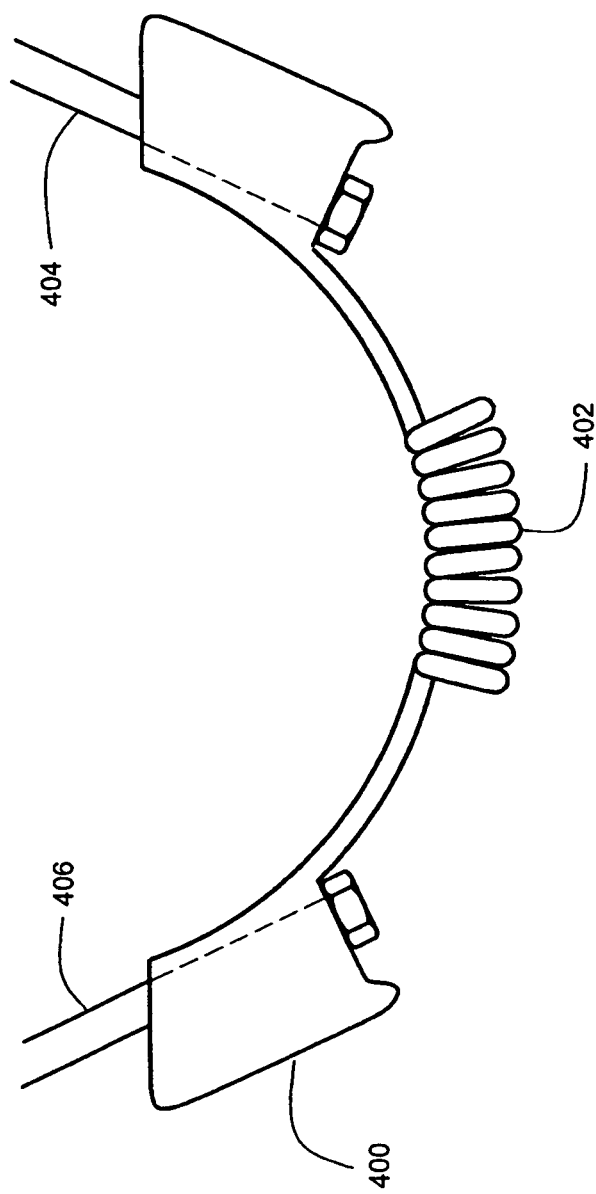

PIPELINE THERMOELECTRIC GENERATOR ASSEMBLY

CROSS-REFERENCE TO RELATED APPLICATIONS

Reference is made to co-pending application Ser. No. 11/070,860, filed Mar. 2, 2005, titled "PROCESS DEVICE WITH IMPROVED POWER GENERATION," the content of which is hereby incorporated by reference in its entirety; and reference is also made to related co-pending U.S. patent application Ser. No. 11/529,767 entitled "THERMOELECTRIC GENERATOR ASSEMBLY FOR FIELD PROCESS DEVICES," filed Sep. 28, 2006, the contents of which are hereby incorporated by reference in their entirety.

BACKGROUND OF THE INVENTION

The present invention relates to industrial process control or monitoring systems. More specifically, the present invention relates to thermoelectric power generation for such systems.

Field instruments are typically widely distributed throughout a process plant and are connected by process control loops to a control system. Field instruments typically require a supply of electrical power for operation. The electrical power can be provided by the control loops themselves or by separate power wiring to the instruments. The amount of power required by each field instrument is usually quite small, and is typically on the order of about 50 milliwatts or less.

When wiring is used for control loops, the wiring is typically enclosed in electrical wiring conduits which require mechanical mounting for support on the framework of process equipment over long distances. Often, the cost of wiring a field instrument over long distances exceeds the cost of the field instrument itself.

When a wireless communication loop is used to communicate with a field instrument, the wireless communication loop does not provide a power supply to the field instrument, and separate power supply wiring is needed.

While the power required for a typical field instrument is extremely low, field instruments are often located in very hot, dangerous or inaccessible locations in the process plant. In such locations, it may be impractical to use a chemical battery as a source of low power in a field instrument. The environments in such locations are often dirty or shielded from sunlight, making use of solar cells for power supply impractical. Solar cells and batteries, in the plant environment, require too much maintenance to be usable for power supply in many field instrument applications.

Process equipment in plants typically include boilers, steam piping, heated tanks and other equipment that are heated or cooled to a temperature that different than ambient air temperature in the process plant. Large temperature differentials are present, and waste heat flows between the ambient air and the process equipment. The amount of energy lost due to a waste heat flow often greatly exceeds the amount of electrical power required by a field instrument.

SUMMARY OF THE INVENTION

Disclosed is a thermoelectric generator assembly. The thermoelectric generator assembly comprises a thermoelectric generator. The thermoelectric generator has a hot junction flange, a cold junction flange and a thermoelectric power output. The thermoelectric generator assembly generates electrical power from heat differentials for use in powering field devices in industrial process monitoring and control systems.

BRIEF DESCRIPTION OF THE DRAWINGS

FIG. 4 illustrates a clamp for a thermoelectric generator assembly.

DETAILED DESCRIPTION OF ILLUSTRATIVE EMBODIMENTS

In the embodiments described below, a thermoelectric generator assembly utilizes waste heat that flows from heated (or cooled) process fluid in a to an ambient temperature in an industrial process environment. The thermoelectric generator assembly includes a thermoelectric generator device that has a hot junction flange that is spaced apart from a cold junction flange.

The hot junction flange is maintained at a temperature that is near the process fluid temperature by mounting it to a process heat pickup that is coupled to a process heat source. The heat pickup has a shape that adapts to a shape of the process heat source and can take a variety of forms such as a pipeline adapter with a concave arc surface to mate with a corresponding convex arc surface of a process vessel, a combustion heat pickup, a steam line heat sink, or other heat exchange device. The heat pickup is preferably formed of aluminum or copper, and provides low thermal resistance between the hot junction flange and the process heat source. Various types of clamps can be used to hold the process heat pickup in close thermal contact with the process heat source. These clamps can also serve to mechanically mount the thermoelectric generator assembly to the process heat source.

The cold junction flange is maintained at a temperature that is near the ambient temperature. The heat sink can take a variety of forms as described below in portions of FIGS. 1-8D. The heat sink provides low thermal resistance between the cold junction flange and the ambient temperature in the industrial process environment.

Through the use of a combination of process heat pickups or heat sinks, a large temperature differential is maintained between the hot junction flange and the cold junction flange. A power output of the thermoelectric generator is enhanced by the large temperature differential to provide adequate power to utilization circuitry.

In one embodiment, circuitry coupled to the thermoelectric power output includes a regulator circuit and an energy storage circuit that stores energy in a capacitance. The energy storage circuit senses when the power output exceeds the use requirement and couples excess power to the capacitance. The energy storage circuit senses when the power output does not meet the use requirement and provides makeup power from the capacitance to the regulator circuit. In another embodiment, the utilization circuitry can be put in either a low power shutdown mode or a cold startup mode by command from a wireless link.

The technology has wide applicability to industrial process environments, such as oil and gas, petroleum refineries, chemical processing, food and beverage processing, HVAC, metals and metallurgical processing, mining, textiles, heavy machinery and other industrial process environments.

Figure 1:
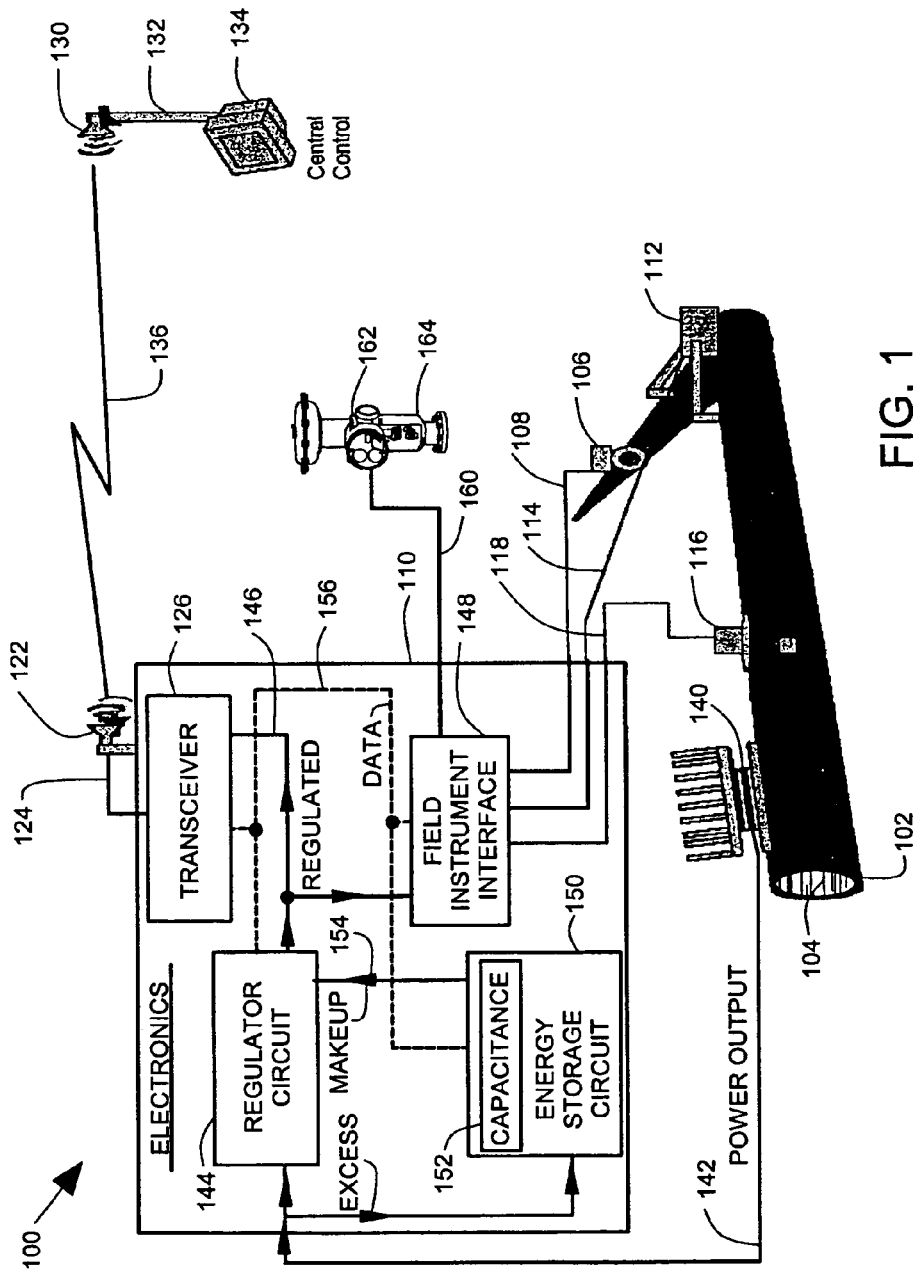
FIG. 1 illustrates a process pipeline carrying a heated process fluid past a thermoelectric generator assembly.

FIG. 1 illustrates a portion of an industrial process plant 100. A process pipe 102 passes through the industrial process plant 100 carrying a process fluid 104. The process fluid 104 can be steam, hot gas/liquid mixtures, natural gas, oil or chemicals. The process fluid 104 is heated during at least one part of a process cycle to a temperature that is significantly above ambient air temperature in the process plant 100. A temperature difference between the process fluid 104 and the ambient temperature is typically in the range of 50-100 degrees centigrade during at least one portion of a process cycle for the process plant. During other portions of the process plant cycle, particularly during a plant shutdown and startup, the process fluid is at a lower temperature, and the temperature difference can be less than 50 degrees centigrade.

A first field device 106 comprises a flow transmitter that senses flow of the process fluid 104. The first field device 106 connects via a loop 108 to an electronics assembly 110. A second field device 112 comprises a pressure transmitter that senses pressure of the process fluid 104. The second field device 112 connects via a second loop 114 to the electronics assembly 110. A third field device 116 comprises a temperature transmitter that senses temperature of the process fluid 104. The third field device 116 connects via a loop 118 to electronics assembly 110. The field devices 106, 112, and 116 are exemplary field devices and other types of known field devices can be used with the electronic assembly 110. The loops 108, 114, 118 can comprise two wire controlled current 4-20 mA wire loops, wireless loops, two wire controlled current multidrop wired loops, field busses and other known types of process device loops. In one embodiment, the loops 108, 114, 118 are wired loops, and the local storage and transmission apparatus 110 provides power to the wired loops 108, 114, 118.

A first antenna 122 (also called transponder 122) couples along line 124 to a transceiver 126 that is in the electronics assembly 110. A second antenna 130 couples along a line 132 to a central control computer 134. The second antenna 130 and the central control computer 134 are remote from the first antenna 122. A wireless communication link 136 is established between the second antenna 130 and the first antenna 122. The wireless communication link 136 carries process data and command communications between the central control computer 134 and the field devices 106, 112, 116. In one embodiment, the first and second antennas 122, 130 are directional antennas as illustrated. The wireless communication link 136 can operate at any suitable band including HF, VHF, UHF, microwave bands, infrared bands and optical bands. Transponders (antennas) 122, 130 can include radio antennas, waveguides or optoelectronic components, depending on the carrier wavelength selected for a particular application.

The electronics assembly 110 stores process data and utilizes the wireless communication link 136 for communicating process data between the central control computer 134 and the field devices 106, 112, 116. With the use of the electronics assembly 110, there is no need for communication wiring running long distances between the field devices 106, 112, 116 and the central control computer 134.

A thermoelectric source 140 provides a power output 142 to the electronics assembly 110. The thermoelectric source 140 has a hot junction with a concave arc-shaped pipeline adapter thermally coupled to the pipeline 102. The thermoelectric source 140 has a cold junction with a heat sink that includes spaced-apart protrusions such as pins or fins. The thermoelectric source 140 is described in more detail below by way of an example illustrated in FIGS. 2-3. A regulator circuit 144 receives the power output 142 and provides a regulated power output 146.

In this embodiment, utilization circuitry includes the transceiver 126 and the field instrument interface 148 which are coupled together by a data bus 156. The utilization circuitry 126, 148 receives and is energized by the regulated output 146. The utilization circuitry 126, 148 has a use requirement for power in order to provide energization currents to the field devices 106, 112, 116, to power the field instrument interface 148 and to power the transceiver 126. In some embodiments, the antenna 122 includes active transponder components, and is included in the utilization circuitry that is energized by the regulated output 146. In one embodiment, the field instrument interface 148 includes a control function and provides a process control output 160 to a field control device. In another embodiment, the field control device comprises a current-to-pressure converter 162 that provides a control pressure to a control valve 164 that controls flow of industrial process fluid. The process control output can use a conventional industrial communication protocol such as a two wire 4-20 mA process control current loop, Hart, or other known industrial communication protocol. The control function of the field instrument interface 148 can be a function of industrial process data received from field instruments 106, 112, 116 or can be a function of industrial process data received wirelessly from central control computer 134 or both.

An energy storage circuit 150 receives the power output 142 and couples power from the power output 142 to a capacitance 152 at those times when the energy storage circuit senses that the power output 142 exceeds the use requirement. The energy storage circuit 150 provides makeup power 154 from the capacitance 152 to the regulator 144 at times when the energy storage circuit 150 senses that the power output 142 does not meet the use requirement. The energy storage circuit 150 selectively couples power to the capacitance 152 only when the capacitance 152 drops below a full charge level. The energy storage circuit 150 couples to the data bus 156 to sense data that indicates whether the use requirement is being met. The data bus 156 couples to the regulator circuit 144, the transceiver 126 and the field instrument interface 148 for obtaining data concerning the use requirement and the power output from the thermoelectric source 140. In one embodiment, the data bus 156 also carries mode change commands from wireless link 136 and transceiver 126.

The field instrument interface 148 is connected to one or more field instruments 106, 112, 140, 162 to energize the field instruments 106, 112, 140, 162 and to communicate data and commands. The power provided to the field instruments 106, 112, 140, 162 is thermoelectric power.

In one embodiment, the utilization circuitry 126, 148 can be put in a shutdown mode by a shutdown command from the wireless link 136. The shutdown command leaves the energy storage circuit 150 functioning to provide power to the capacitance, such that stored energy is available to the utilization circuitry 126, 128 during a cold startup mode following the shutdown mode. In this embodiment, the utilization circuitry 126 operates in a low power mode during the shutdown mode and during the cold startup mode. In one embodiment, the capacitance 152 comprises one or more supercapacitors to provide large energy storage without the use of batteries.

The electronic assembly 110, which is typically implemented using microprocessor circuitry, can store and transmit data using thermoelectric power. Data storage can be done locally in electronics assembly 110 or can be transmitted instantaneously to the central control room. Data transmission can be done in a group or through individual transmission.

Figure 3:
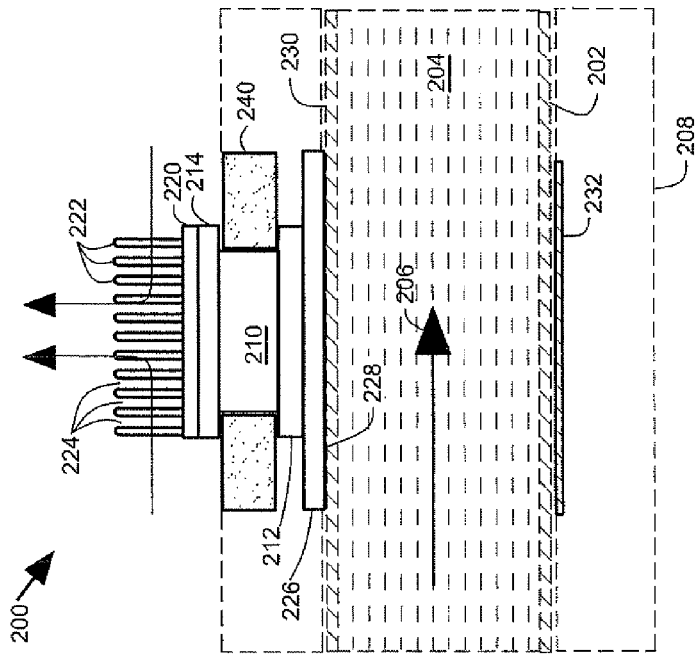
FIG. 3 illustrates a side sectional view of the thermoelectric generator assembly in FIG. 2.
Figure 2:
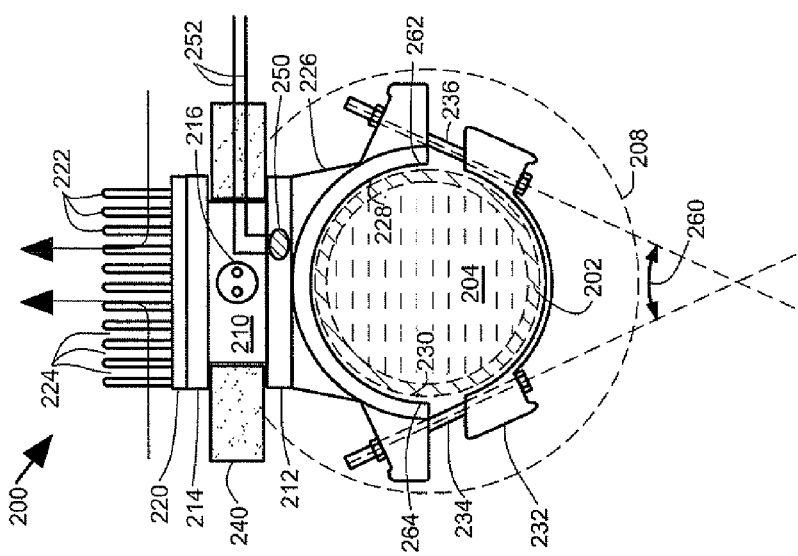
FIG. 2 illustrates a front sectional view of a thermoelectric generator assembly.

FIG. 2 illustrates a front sectional view and FIG. 3 illustrates a side sectional view of a thermoelectric generator assembly 200 mounted to a pipeline 202. The pipeline 202 is filled with a hot process fluid 204 that is flowing in a direction indicated by arrow 206. The pipe 202 is optionally enclosed in a layer of thermal pipeline insulation 208 to reduce waste heat loss.

The thermoelectric generator assembly 200 comprises a thermoelectric generator 210 having a hot junction flange 212 and a cold junction flange 214 and a thermoelectric power output 216 (FIG. 2).

The thermoelectric generator assembly 200 comprises a heat sink 220. The heat sink 220 has multiple protrusions 222 that are thermally coupled to the cold junction flange 214. Air flow spaces 224 are provided between the protrusions 222. In various embodiments, the protrusions 222 are generally cylindrical pins, as illustrated, fins or other shapes that provide a large surface area for coupling heat to air in air flow spaces. Other types of heat sinks can be used as well, for example heats sinks as described below in connection with FIGS. 7-8D.

The thermoelectric generator assembly 200 comprises a pipeline adapter 226. The pipeline adapter 226 has a concave, generally cylindrical, arc surface 228 that is thermally coupled to the hot junction flange 212. The concave arc surface 228 has a shape and a size to mate with a corresponding convex arc surface 230 of the pipeline 202.

In one embodiment, the concave arc surface 228 extends over an arc of no more than 180 degrees. In this embodiment, the concave arc surface 228 is mateable with the convex arc surface 230 without sliding over an open end of the pipeline 202.

A clamp 232 mechanically couples to the pipeline adapter 226 by bolts 234, 236. The bolts 234, 236 are tightened, and the clamp 232 urges the concave arc surface 228 toward the convex outer surface 230 of the pipeline 202.

A clamp 232 mechanically couples to the pipeline adapter 226 by bolts 234, 236. The bolts 234, 236 are mounted at an acute angle 260 with respect to one another as illustrated in FIG. 2. The bolts 234, 236 are tightened, and the clamp 232 urges the concave arc surface 228 toward the convex outer surface 230 of the pipeline 202. When the concave arc surface 228 has a diameter that is larger than a diameter of the pipeline 202, outer ends 262, 264 of the concave arc surface 228 are drawn toward the convex outer surface 230 as the bolts 234, 236 (which are at the acute angle 260) are tightened.

In one embodiment, the concave arc surface 228 can have a diameter that is larger than a diameter of the pipeline 202. In this embodiment, tightening the clamp 232 compresses the concave arc surface 228 to fit the pipeline 202. In another embodiment, the concave arc surface 228 has a diameter that is smaller than a diameter of the pipeline 202. In this embodiment, tightening the clamp 232 expands the concave arc surface to fit the pipeline 202.

It is thus possible to manufacture a pipeline adapter 226 that fits a particular nominal pipeline size (such as a nominal 4" pipe), but that can be fit to pipes with slightly different diameters (different wall thicknesses or pipe schedule size) by compressing or expanding the diameter of the concave arc surface 228 by tightening the clamp 232.

In one embodiment the pipeline adapter 226 comprises a massive, solid metal body with a large cross-section transverse to a direction of major heat flow, providing low thermal resistance. Aluminum and copper are preferred metals for the pipeline adapter 226.

In one embodiment, a layer of thermal insulation material 240 is disposed between peripheral rims of the hot junction flange 212 and the cold junction flange 214. The thermal insulation material 240 extends outwardly from thermoelectric generator 210. In one embodiment, the thermal insulation material 240 comprises refractory ceramic material.

The pipeline adapter 226 is mounted completely externally to the pipeline 202. The mounting is completed without cutting a hole in the pipeline 202. The use of a thermowell is avoided.

In one embodiment, a thermally conductive coating (not illustrated) that is deformable is provided between the concave surface 228 and the convex surface 230. The thermally conductive coating extrudes out during tightening of the clamp 232 and leaves a thin layer of coating that fill gaps between the concave arc surface 228 and the pipeline 202. The thin layer reduces thermal resistance between the surfaces 228, 230. In one embodiment, the thermally conductive coating comprises conventional heat sink grease.

Besides a pipeline adapter or process vessel adapter, other types of process heat source adapters can be uses as well, for example a combustion chamber adapter described below in connection with FIG. 7. Other heat source adapters can be fabricated to fit specific shapes of the heat source without breaching pressurized process fluid vessels.

In one embodiment a temperature sensor 250 is mounted on the hot junction flange 212 adjacent to the pipeline adapter 226 for sensing process fluid temperature. Leads 252 from the temperature sensor 250 couple to a temperature transmitter (such as temperature transmitter 116 in FIG. 1). The use of a thermowell for the temperature sensor 250 is avoided by placing the temperature sensor 250 on the hot junction flange 212 adjacent to the pipeline adapter 226. Important process temperature information is obtained without the use of a thermowell. The temperature sensor 250 is preferably a resistor temperature detector (RTD). Thermal insulation (such as thermal insulation 208 and 240) reduces heat loss from the pipeline adapter 226 and minimizes any temperature difference between the process 204 and the temperature sensor 250.

The temperature sensor 250 can provide important diagnostic information concerning the process fluid. If there is leak in the pipe that is carrying a gaseous fluid, then pressure in the pipeline will drop instantaneously which, in turn will decrease the temperature sensed by the temperature sensor 250. If the sensed temperature drops below its noise value, an alarm can be communicated to check for a leak. In another situation, if the line pressure increases due to plugged line or other reason where the flow has got choked downstream, temperature of flowing liquid or gas will increase, and another type of alarm can be communicated.

Hence, by measuring the temperature of the pipe line, information about the leak and the plugged line can be detected instantaneously. This is very useful information for the process industries where pipe line is stretched miles after miles. This is true for in-plant piping as well.

As illustrated in FIG. 4, a clamp 400 can include a spring 402 that is energized when the clamp 400 is tightened by tightening bolts 404, 406. The clamp 400 is exemplary, and various types of clamps can be used, with or without springs. When springs are included, the springs can be compression springs or extension springs. Springs can be formed in any known shape including coil springs, leaf springs and torsional springs. The use of springs is preferred in order to provide a relatively constant clamping force as the pipeline changes dimension due to thermal expansion. Hose clamps with metal straps that encircle a pipeline and the pipeline adapter can also be used for clamping.

Figure 5:
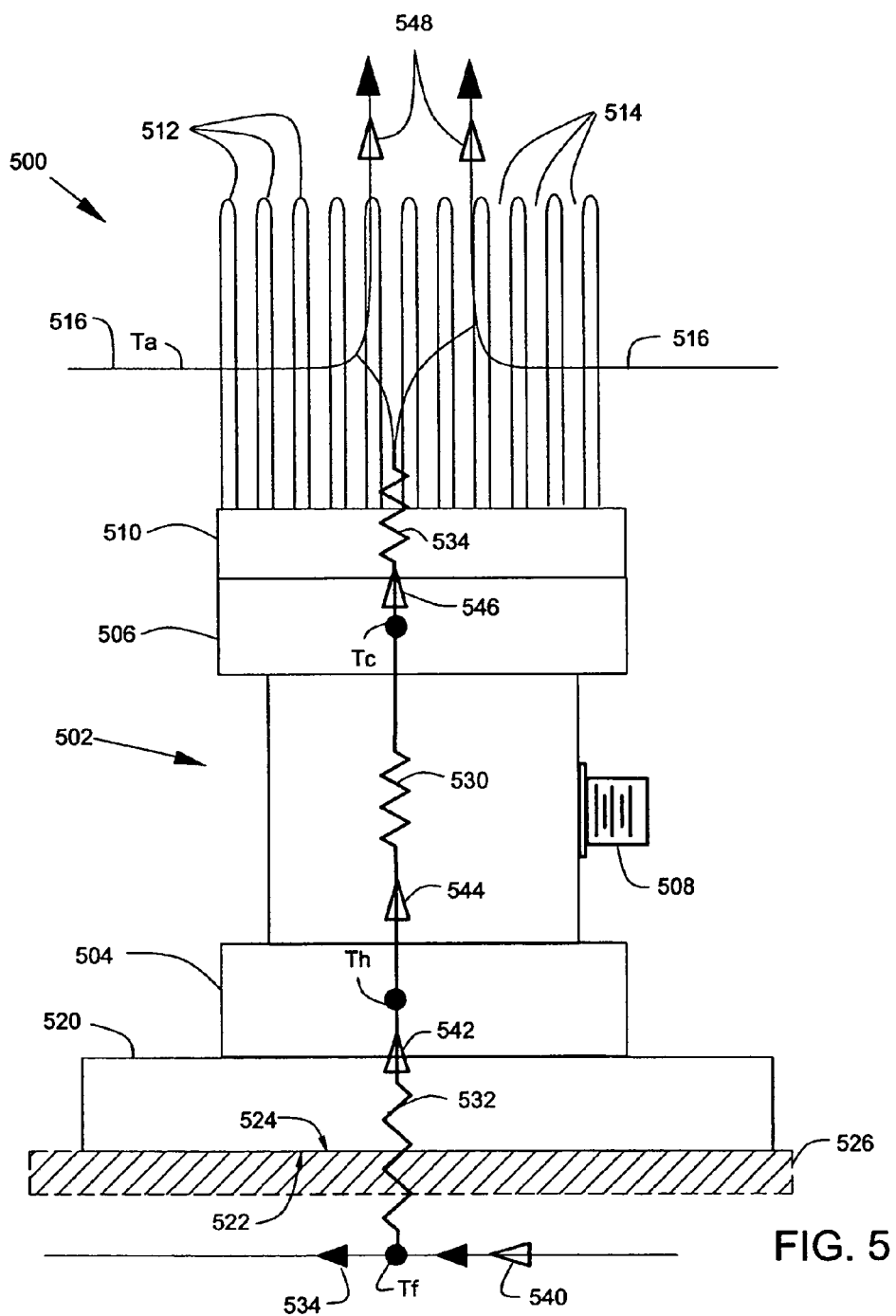
FIG. 5 illustrates thermal aspects of a thermoelectric generator assembly.

FIG. 5 is an illustration of a thermoelectric generator assembly 500 that emphasizes thermal aspects according to a simplified thermal model. The thermoelectric generator assembly 500, which is illustrated thermally, is comparable to the thermoelectric generator assembly 200, which is illustrated mechanically. The thermoelectric generator assembly 500 comprises a thermoelectric generator 502 that has a hot junction flange 504 and a cold junction flange 506 and a thermoelectric power output connector 508. The thermoelectric generator assembly 500 has a heat sink 510 with protrusions 512 that are thermally coupled to the cold junction flange 506. There are air flow spaces 514 between the protrusions 512. Air flow 516 (indicated by solid arrows) passes through the air flow spaces 514. A pipeline adapter 520 has a cylindrical concave arc surface 522 that is thermally coupled to the hot junction flange 504. The concave arc surface 522 has a shape and size to mate with a corresponding convex arc surface 524 of a pipeline 526.

The thermoelectric generator 502 has a thermal resistance 530 between the hot junction flange 504 (at a temperature Th) and the cold junction flange 506 (at a temperature Tc). The pipeline adapter 520 and the pipeline 526 have a thermal resistance 532 to flowing fluid 534 in the pipeline 526. The heat sink 510 has a thermal resistance 534 between the cold junction flange 506 and the flowing ambient air 516. A major heat flow (indicated by open arrows 540, 542, 544, 546, 548 flows through the thermal resistances 532, 530, 534 from the flowing fluid 534 to the flowing air 516. Due to the major heat flow, a temperature difference (Th−Tc) is established between the hot junction flange 504 and the cold junction flange 506. The thermoelectric power output 508 depends upon this temperature difference for generating power. There is an objective to maintain the hot junction flange temperature Th as near as possible to a temperature Tf of the fluid, and there is also an objective to maintain the cold junction flange temperature Tc as close as possible to the ambient air temperature Ta.

The heat sink 510 has the advantage that the protrusions 512 provide a large surface area for airflow 516 to carry heat away to the ambient environment. Because of the large surface area of the protrusions 512, the thermal resistance 534 is reduced, and the cold junction flange temperature Tc is kept close to the ambient temperature Ta. In one embodiment, insulation material (such as insulation material 240 in FIGS. 2-3) can be added to reduce thermal exposure of the heat sink to the pipeline.

The pipeline adapter 520 has the advantage of a large mating surface area contact between the concave arc surface 522 and the convex surface 524 of the pipeline. Because of the large surface area of the concave arc surface 522, the thermal resistance 532 is reduced, and the hot junction flange temperature Th is kept close to the flowing process fluid temperature Tf.

Since both the hot and cold junction flanges are cooled by flowing fluids, there is an optimized heat flow 544 through the thermal resistance 530. The optimized heat flow is optimized relative to leakage heat flows which are blocked by spacing and insulation. A large available power output 508 is available.

In one embodiment the thermoelectric generator assembly 500 includes electronic circuitry such as that shown in FIG. 1. Since the energy storage circuit stores power in a capacitance only when it is needed, only a portion of the power output that is available to meet the power use requirement is actually taken from the power output. Current flow is reduced and the amount of power output used is reduced, and hot and cold junction currents are correspondingly reduced, limiting undesired heating of the cold junction flange 506. Semiconductor thermoelectric piles are preferred as thermoelectric sources because of their high efficiencies.

Thermoelectric generator (TEG) technology provides conversion of heat flow directly into electrical power. TEG technology is renewable, has a very long operating lifetime (15 years or more), and is environmentally friendly. The efficiency of TEG depends on the thermoelectric figure of merit which is a function of electrical conductivity, Seebeck coefficient, and thermal conductivity.

Figure 6:
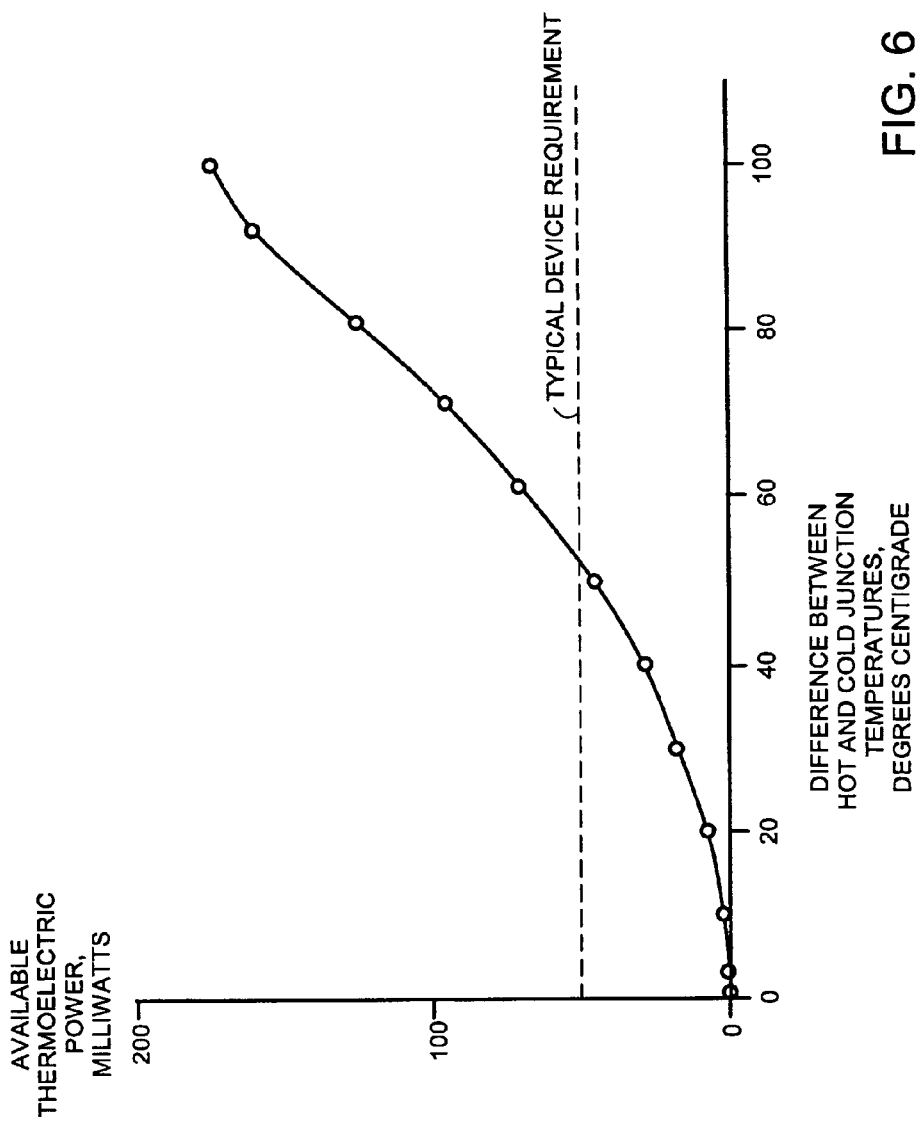
FIG. 6 illustrates a graph of available thermoelectric power as a function of a difference between hot and cold junction temperatures.

As illustrated in FIG. 6, thermoelectric generator technology is capable of converting heat available in a process plant to electrical power which is then sufficient to feed to the microprocessor circuitry in electronic assemblies (such as electronics assembly 110 in FIG. 1) where power requirements are in the range of 50 to 150 mW for data storage and transmission.

Figure 7:
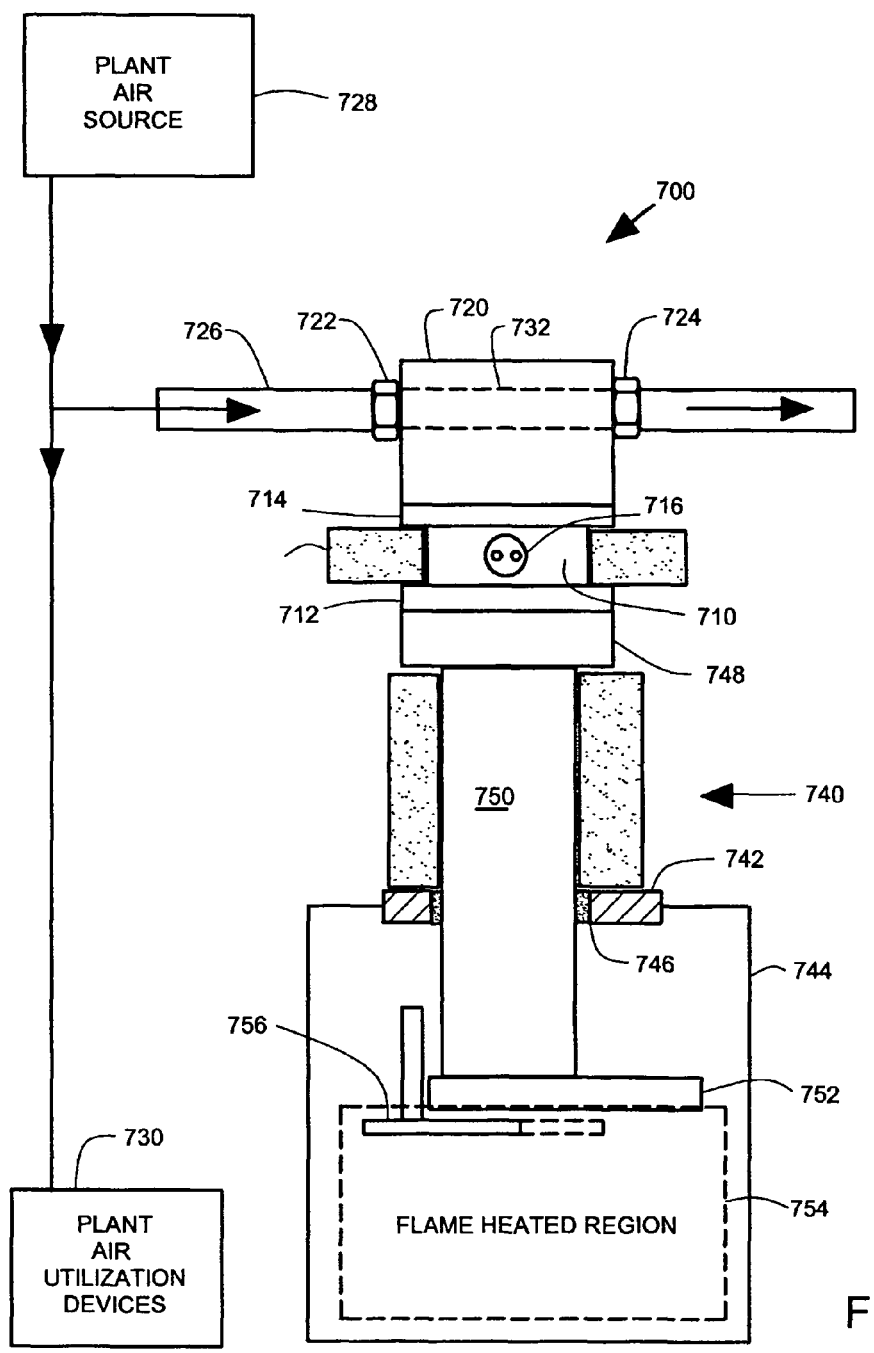
FIG. 7 illustrates a plan view of a thermoelectric generator assembly.

FIG. 7 illustrates a plan view of a thermoelectric generator assembly 700. The thermoelectric generator assembly 700 comprises a thermoelectric generator 710 having a hot junction flange 712, a cold junction flange 714 and a thermoelectric power output 716.

The thermoelectric generator assembly 700 comprises a heat sink 720. The heat sink 720 comprises a plant air inlet 722 and a plant air outlet 724. The plant air inlet 722 is connected to a plant air line 726 that receives pressurized air from a plant air source 728.

The plant air source 728 typically comprises an air compressor, pressurized air storage tank, pressure regulators, air filters, air dryers and a heat exchanger which cools compressed air down to near the ambient temperature of the industrial process environment. The plant air source 728 can be of conventional design and also provided pressurized plant air to plant air utilization devices 730 such as air actuated valves, bubblers, air motors and other process devices.

The plant air outlet 724 carries pressurized air away from the heat sink 720 after the pressurized air has passed through an internal passageway 732 in the heat sink 720. The heat sink 720 can comprise a block of metal (aluminum or copper, for example) and the internal passageway 732 can be straight or follow a serpentine path through the heat sink 720. Heat flows from the cold junction flange 714 to the moving air in the internal passageway 732. Heat is thereby expelled to the industrial process environment, and the cold junction flange 714 is cooled by plant air. The plant air that passes through the heat sink 720 can be either passed on to another plant air utilization device before it is exhausted to the ambient air, or it can exhausted directly from plant air outlet 724.

The thermoelectric generator assembly 700 comprises a combustion chamber adapter 740. A door 742 on a combustion chamber 744 is provided with a throughhole 746. The combustion chamber adapter 740 passes through the through hole 746. In one embodiment, the combustion chamber adapter 740 mounts to the door 742. The combustion chamber adapter 740 has a heat transfer plate 748 that is coupled to the hot junction flange 712. A shaft 750 extends from the heat transfer plate 748 through the throughhole 746 to a heat pickup 752 in the combustion chamber 744. The heat pickup is shaped to scavenge an appropriate amount of heat from a flame-heated region 754 in combustion chamber 744 while not interfering with gas flow in the combustion chamber 744. Shapes of the heat pickup 752 may include a flat plate as illustrated, a grille or other shapes that are compatible with the hot gas flow regime in the combustion chamber 744.

In one embodiment, the combustion chamber adapter adapter 740 is mounted to the door 742 so that the door 742 can be swung open for inspection of the interior of combustion chamber 744.

In one embodiment, one or more movable shutters 756 are provided in the combustion chamber 744 to vary shielding of the heat pickup 752 from the flame heated region 754 to provide thermostatic control. The shutters 756 include spiral bimetallic elements that rotate the positions of the shutters to vary shielding of the heat pickup 752 to avoid overheating the thermoelectric generator assembly 700 when there is high heat output in the combustion chamber 744.

FIGS. 8A-8D illustrate exemplary embodiments of the heat sink 720.

Figure 8A:
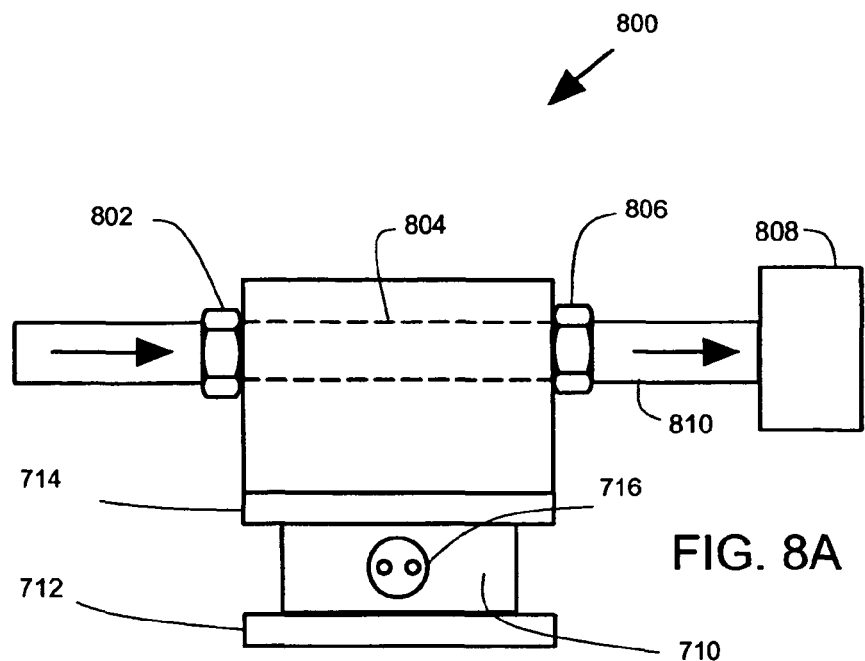
FIGS. 8A-8D illustrate exemplary embodiments of the heat sink.

FIG. 8A illustrates an embodiment of a heat sink 800 in which the plant air passes from a plant air inlet 802 through a passageway 804 to a plant air outlet 806 with little restriction or pressure drop. The plant air outlet 806 is piped to a utilization device 808 (such as a current-to-pressure converter (I/P) or valve) that maintains sufficient air flow for cooling the heat sink 800. A length of pipe 810 between the plant air outlet 806 and the utilization device 808 allow for cooling of plant air before it reaches the utilization device 808. In one embodiment, the passageway 804 is a serpentine passageway to increase surface area for heat exchange with the plant air.

Figure 8B:
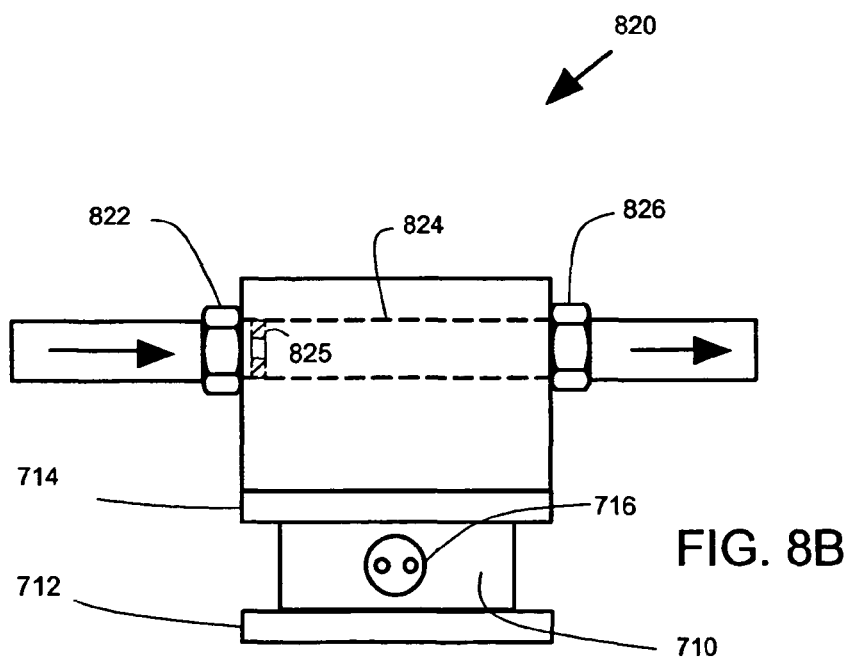

FIG. 8B illustrates an embodiment of a heat sink 820 in which plant air passes from a plant air inlet 822 through a passageway 824 to a plant air outlet 826. Plant air is vented to the atmosphere from the plant air outlet 826. The passageway 824 is restricted to limit consumption of plant air by the heat sink 820. In one embodiment the restriction comprises a long, narrow serpentine shape for the passageway 824. In another embodiment, the restriction comprises an orifice plate 825 in the passageway. In one embodiment, the orifice plate is positioned near the plant air inlet 822, providing additional cooling of the heat sink due to expansion of the plant air passing through the orifice plate. The orifice plate can comprise any know type of orifice or orifices that are suitably sized for the desired consumption of plant air.

Figure 8C:
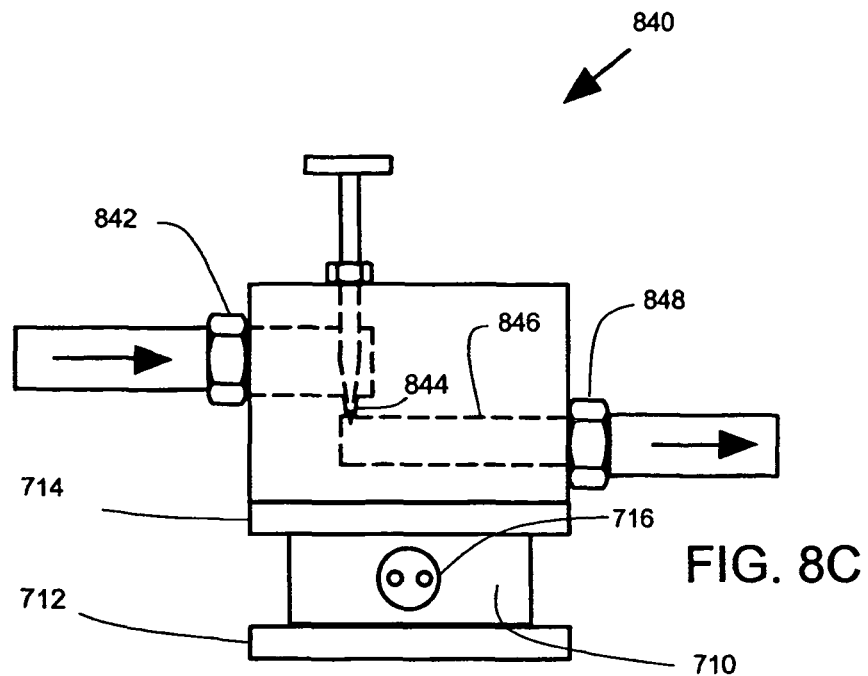

FIG. 8C illustrates an embodiment of a heat sink 840 in which plant air passes from an plant air inlet 842 through a valve 844 and a passageway 846 to a plant air outlet 848. Plant air is vented from the plant air outlet 848. The valve 844 is manually adjustable to set a desired consumption of plant air. In one embodiment the valve 848 is placed close to the plant air inlet 842, providing additional cooling of the heat sink 840 due to expansion of the plant air in the heat sink.

Figure 8D:
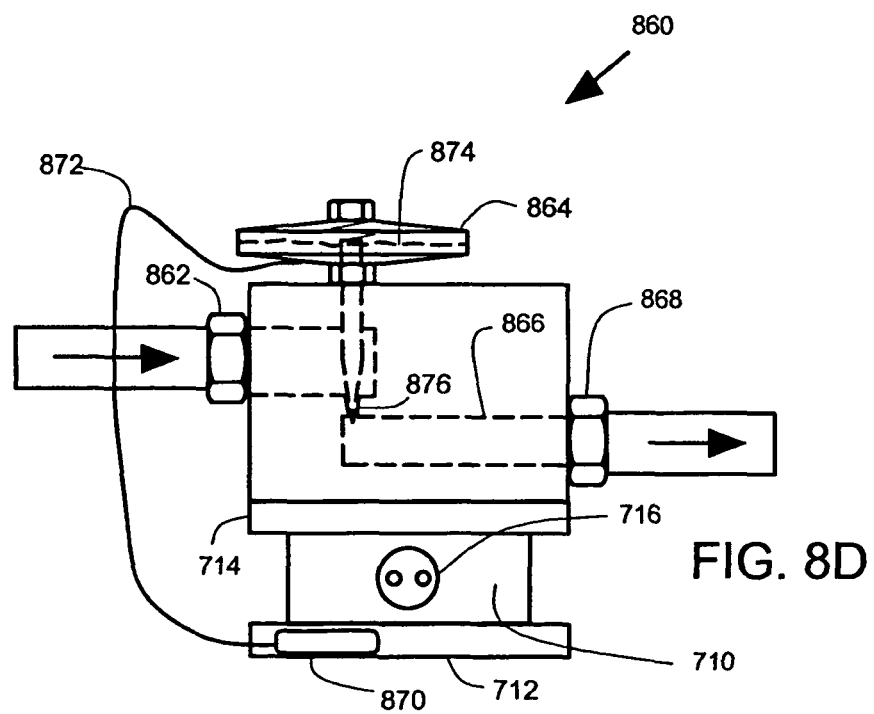

FIG. 8D illustrates an embodiment of a heat sink 860 in which plant air passes through a plant air inlet 862, a thermostatically controlled valve 864, a passageway 866 and a plant air outlet 868. Plant air is vented from the plant air outlet 868. The thermostatically controlled valve 864 includes a gas-filled temperature sensing bulb 870 that is thermally coupled to a selected location on the thermoelectric generator assembly for temperature sensing. In one embodiment, the selected location is the cold junction flange 714. In another embodiment, the selected location is the hot junction flange 712. In another embodiment, the selected location is on the heat sink 860 near the plant air outlet 868. Other selected locations can be used as well. The gas-filled temperature sensing bulb 870 is pressure coupled via a capillary tube 872 to a diaphragm 874. the diaphragm 874 deflects as a function of temperature to actuate a needle valve 876 that regulates flow of plant air.

Combinations of selected features of the embodiments described above are also contemplated. Changes can be made to fit the needs of a particular application. In one embodiment, a hot side combustion chamber adapter is used along with a cold side finned heat sink. In another embodiment, an arced hot side adapter is used with a plant air heat sink on the cold side. In another embodiment, heat sinks are used on both the hot side and cold side of the thermoelectric generator, with the cold side heat sink cooled by plant air and the hot side heat sink heated by steam from a steam line, or heated liquid from a heated process line.

While the embodiments described above show use on a heated pipeline, it will be understood that the embodiments can also be used on pipelines that are cooled below ambient temperature such that the temperature differential is reversed. The pipeline and hot junction flange can be colder than the cold junction flange and ambient, and the thermoelectric generator will function normally. The polarity of connections to the thermoelectric power are reversed in such an installation on a chilled pipeline.

Although the present invention has been described with reference to preferred embodiments, workers skilled in the art will recognize that changes may be made in form and detail without departing from the spirit and scope of the invention.

What is claimed is:

1. A thermoelectric generator assembly for field devices in an industrial process environment, comprising:
   a thermoelectric generator having a hot junction flange and a cold junction flange, and providing a thermoelectric power output;
   a heat sink thermally coupled to the cold junction flange, and couplable to the industrial process environment;
   a process heat source adapter thermally coupled to the hot junction flange and configured to mount to a combustion chamber of an industrial process and having a process heat pickup which extends into the combustion chamber whereby the combustion chamber provides a process heat source;
   a movable shutter provided in the combustion chamber to vary shielding of the process heat pickup; and
   the process heat pickup extracting heat from the process heat source such that the thermoelectric power output is sufficient to energize at least one field device,
   wherein the heat sink comprises a pressurized plant air inlet, a pressurized plant air outlet and an internal passageway connecting the pressurized plant air inlet and pressurized plant air outlet, wherein the pressurized plant air inlet and pressurized plant air outlet are configured to connect with a pressurized air line carrying pressurized plant air to a plant air utilization device.

2. The thermoelectric generator assembly of claim 1 and further comprising a temperature sensor coupled to the hot junction flange.

3. The thermoelectric generator assembly of claim 2 wherein the temperature sensor comprises a resistance temperature detector (RTD).

4. The thermoelectric generator assembly of claim 1 wherein the process heat pickup comprises a combustion heat pickup.

5. The thermoelectric generator assembly of claim 1, comprising: a layer of thermal insulation material disposed between peripheral rims of the hot junction flange and the cold junction flange and extending outwardly from the thermoelectric generator.

6. The thermoelectric generator assembly of claim 1 wherein the process heat pickup is mounted to the process heat source without cutting a hole in the process heat source.

7. The thermoelectric generator assembly of claim 1 including a restriction in the internal passageway to control flow of pressurized plant air through the heat sink.

8. The thermoelectric generator assembly of claim 1 including a valve used to control flow of pressurized air through the heat sink.

9. The thermoelectric generator assembly of claim 8 including a temperature sensor coupled to the hot junction flange and wherein the valve is responsive to an output from the temperature sensor.

10. The thermoelectric generator assembly of claim 1 wherein the movable shutter provides thermostatic control.

11. The thermoelectric generator assembly of claim 1 wherein the movable shutter includes a bi-metallic element.

* * * * *